(12) United States Patent
Kato

(10) Patent No.: US 6,388,289 B1
(45) Date of Patent: May 14, 2002

(54) SEMICONDUCTOR DEVICE HAVING ELECTROSTATIC DISCHARGE PROTECTION CIRCUIT

(75) Inventor: Katsuhiro Kato, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/488,519

(22) Filed: Jan. 21, 2000

(30) Foreign Application Priority Data

Jan. 28, 1999 (JP) ............................................ 11-019531

(51) Int. Cl.$^7$ ............................................... H01L 27/01
(52) U.S. Cl. ...................... 257/347; 257/344; 257/357; 257/408
(58) Field of Search ................................ 257/344, 355, 257/356, 359, 408, 347, 447

(56) References Cited

U.S. PATENT DOCUMENTS 5,086,365 A * 2/1992 Lien ............................ 361/58
5,963,409 A * 10/1999 Chang ........................ 361/565
6,080,612 A * 6/2000 Hsu ............................. 438/202

\* cited by examiner

*Primary Examiner*—Olik Chaudhuri
*Assistant Examiner*—Nathan W. Ha
(74) *Attorney, Agent, or Firm*—Junichi Mimura

(57) ABSTRACT

A semiconductor device having an electrostatic discharge protection circuit, manufactured by a SOI-CMOS process, the device includes an output terminal and a ground terminal. The electrostatic discharge protection circuit is formed on an insulator, and includes a lightly doped diffusion layer of a given conductivity type, two first highly doped diffusion layers of the given conductivity type, and a gate electrode formed on a gate insulating layer which is formed on the lightly doped layer, the lightly doped diffusion layer being sandwiched by the highly doped layers, one of the highly doped layers being connected to the output terminal and the gate electrode being connected to the ground terminal. An output transistor of the given conductivity type having a gate electrode, a source and a drain, the source being connected to the ground terminal. The protection circuit and the output transistor are connected to each other in series, between the output terminal and the ground terminal.

20 Claims, 14 Drawing Sheets

US 6,388,289 B1

SEMICONDUCTOR DEVICE HAVING ELECTROSTATIC DISCHARGE PROTECTION CIRCUIT

CROSS-REFERENCE TO RELATED APPLICATION

This application claims the priority benefit of Japanese Patent Application No. 11-019531, filed Jan. 28, 1999, the entire subject matter of which is incorporated herein by reference.

BACKGROUND OF THE INVENTION

1. Field of the Invention

The invention relates to a semiconductor device and, more particularly, to a semiconductor device manufactured by a SOI-CMOS process.

2. Description of the Related Art

Currently, based on requirements for low power consumption and high integration, a CMOS-IC (Complementary Metal Oxide Semiconductor-integrated Circuit) is in the mainstream of semiconductor devices. Specifically, SOI (Silicon-On-Insulator) technology is used to further reduce power consumption, and to obtain high performance with low power. In a CMOS structure using SOI technology (hereinafter SOI-CMOS), a device element such as a transistor is isolated from other elements at its side surface by a LOCOS (Local Oxidation of Silicon) layer, and is isolated from a silicon substrate there below by a silicon oxide layer. Therefore, it is possible to reduce junction leakage current in SOI-CMOS. Further, as it is possible to design a transistor's characteristics regardless of the impurity in the semiconductor substrate, high performance with low power can be expected.

However, a conventional electrostatic discharge protection circuit cannot be used in a semiconductor device having a SOI-CMOS structure because the surge resistance per unit area of the device element (e.g. transistor) in a SOI-CMOS structure is lower than in a general CMOS structure. The reason why the conventional electrostatic discharge protection circuit can not be used in SOI-CMOS is explained below.

Referring to FIG. 14, an electrostatic discharge protection circuit 5000 includes a PMOS protection transistor 52 and an NMOS protection transistor 53, which are connected together in series. The PMOS protection transistor 52 and the NMOS protection transistor 53 are respectively connected in parallel to a PMOS output transistor 50 and a NMOS output transistor 51 that are connected together in series. Drain electrodes of the transistors 50, 51, 52, 53 are commonly connected to an output terminal 100. A source electrode of the PMOS output transistor 50 and a gate electrode and a source electrode of the PMOS protection transistor 52 are connected to power supply 200. A source electrode of the NMOS output transistor 51 and a gate electrode and a source electrode of the NMOS protection transistor 53, are connected to ground 300 for an external connection. As the output transistors 50, 51 are respectively connected in parallel to the protection transistors 52, 53, the electrostatic surge applied through the output terminal 100 can be branched into the output transistors 50, 51 and the protection transistors 52, 53. That is why the circuit 5000 provides the electrostatic surge resistance.

Next, referring to FIGS. 15 and 16, the structural difference between the CMOS and the SOI-CMOS is explained using the NMOS transistors 51, 53 as an example. In the conventional CMOS structure shown in FIG. 15, the NMOS output transistor 51 includes N-type diffusion layers 51s, 51d serving respectively as a source and a drain, a P-type substrate 60 sandwiched between the diffusion layers 51s, 51d serving as a channel region, and the gate electrode 51g which is disposed on the channel region 61 and formed on a thin gate oxide layer 74. The NMOS protection transistor 53 has the same structure as the NMOS output transistor 51. These NMOS transistors 51 and 53 are electrically isolated from each other by the LOCOS layer 70. However, as the channel regions 61 of the NMOS transistors 51 and 53 are parts of the P-type substrate 60, they are physically connected to each other.

On the other hand, in the conventional SOI-CMOS structure shown in FIG. 16, the structure of the NMOS transistors 51, 53 is the same as the NMOS transistors used in the CMOS structure. The difference between the CMOS structure and the SOI-CMOS structure is that the NMOS transistors 51 and 53 are formed on an oxide layer 80. Therefore, the channel region 60 of the NMOS output transistor 51 is isolated from the channel region 61 of the NMOS protection transistor 53 both electrically and physically.

The main reason why the NMOS transistors 51, 53 are destroyed by the electrostatic surge is that a PN junction of a source or a drain is physically damaged by joule heat attendant to the surge current. Therefore, if a circuit has such a structure that the joule heat can not be diffused, the circuit is easily destroyed. In the CMOS structure, as the channel regions 61 is connected through the P-type substrate 60, the joule heat which occurs at the PN junction of the source/drain and channel region is easily diffused. On the other hand, in the SOI-CMOS structure, as the NMOS transistors 51, 53 are isolated from each other by the LOCOS layer 70 between them and the oxide layer 80 below them, it is difficult for the joule heat generated at the PN junction of the source/drain and channel region to be diffused away. Therefore, in the SOI-CMOS structure, it is easy for the PN junction to reach the critical temperature thereby be destroyed.

SUMMARY OF THE INVENTION

An objective of the invention is to resolve the above-described problem and to provide a semiconductor device having a SOI-CMOS whose an electrostatic discharge protection circuit can be kept small and which has an improved resistance to electrostatic destruction.

This objective is achieved by a semiconductor device manufactured by a SOI-CMOS process, that includes an output terminal and a ground terminal and a first electrostatic discharge protection circuit formed on an insulator, the first protection circuit including a first lightly doped diffusion layer of a first conductivity type, two first highly doped diffusion layers of the first conductivity type, and a first gate electrode formed on a gate insulating layer which is formed on the first lightly doped layer. The first lightly doped diffusion layer is sandwiched by the first highly doped layers. One of the first highly doped layers is connected to the output terminal and the first gate electrode is connected to the ground terminal. The source of a first conductivity type output transistor is connected to the ground terminal. The first protection circuit and the first conductivity type output transistor are connected to each other in series, between the output terminal and the ground terminal.

The objective is further achieved by adding to the semiconductor device described above, a second protection circuit which has the same structure and connection as the first protection circuit and a first conductivity type protection transistor. In this case, the second protection circuit and the first conductivity type protection transistor are connected to each other in series, and are connected in parallel to the first protection circuit and the output transistor, between the output terminal and the ground terminal.

The objective is further achieved by adding to either of the semiconductor devices described above, a third protection circuit and a second conductivity type protection transistor. In this case, the third protection circuit has a lightly doped diffusion layer of a second conductivity type, two highly doped diffusion layers of the second conductivity type, and a gate electrode formed on a gate insulating layer which is formed on the lightly doped layer. The gate electrode of the third protection circuit and a gate electrode of the second conductivity type protection transistor are commonly connected to a power supply. The second conductivity type protection transistor and the third protection circuit are connected to each other in series, and are connected in parallel to the first and/or second protection circuits, between the output terminal and the ground terminal.

BRIEF DESCRIPTION OF THE DRAWINGS

The invention will be more particularly described with reference to the accompanying drawings in which.

DETAILED DESCRIPTION OF THE PREFERRED EMBODIMENTS

Figure 1:
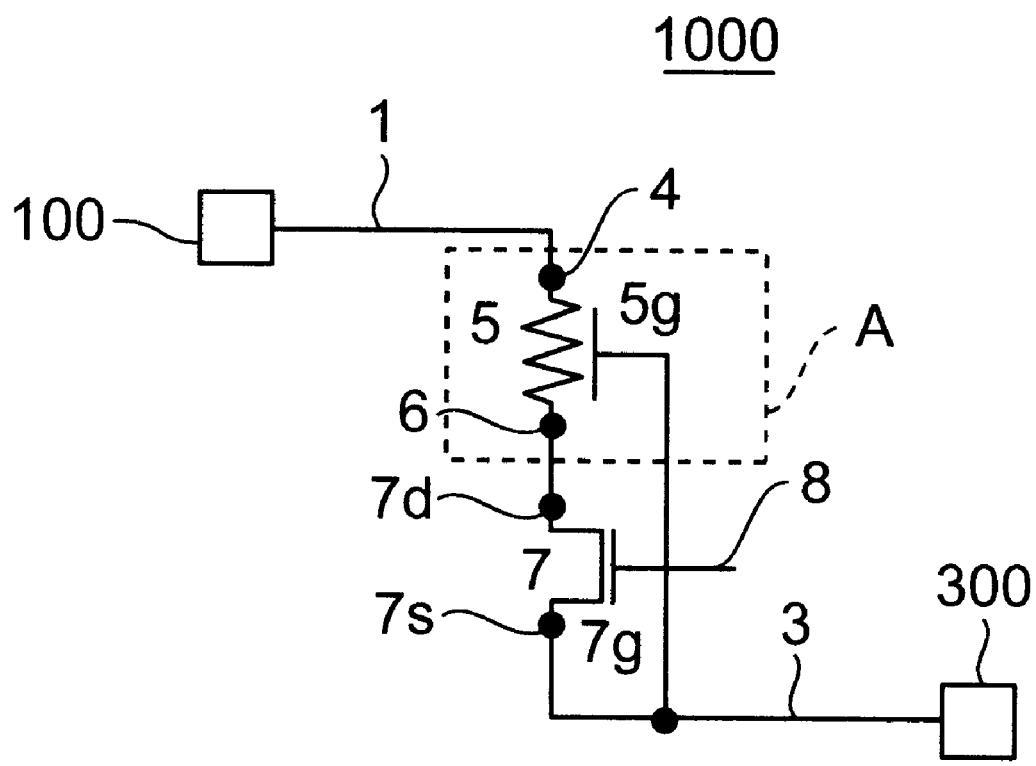
FIG. 1 is a circuit diagram of a semiconductor device having an electrostatic discharge protection circuit according to a first embodiment of the invention.

Referring to FIG. 1 a semiconductor device 1000 includes an electrostatic discharge protection circuit A, a ground terminal 300 for an external connection, an NMOS output transistor 7 having a source 7s, a drain 7d and a gate electrode 7g, and an output terminal 100 for an external connection. The electrostatic discharge protection circuit A includes an N-type impurity lightly doped diffusion layer 5, an N-type impurity highly doped diffusion layers 4, 6 sandwiching the lightly doped diffusion layer 5, and a gate electrode 5g formed on a gate insulating layer which is formed on the lightly doped diffusion layer 5. The impurity density of the highly doped layers 4,6 is two digit higher than that of the lightly doped layer 5. To be concrete, the impurity density of the highly doped layers 4,6 are set as $1E19 ions/cm^3$, and the impurity density of the lightly doped layer 5 is set as $1E17 ions/cm^3$.

The source 7s is connected to the ground terminal 300 via a ground line 3, and the drain 7d is connected to the highly doped diffusion layer 6. The gate electrode 7g is connected to a signal line for activation. The highly doped diffusion layer 4 is connected to the output terminal 100 via a connecting line 1. The gate electrode 5g is connected to the ground terminal 300 via a ground line 3.

Figure 2:
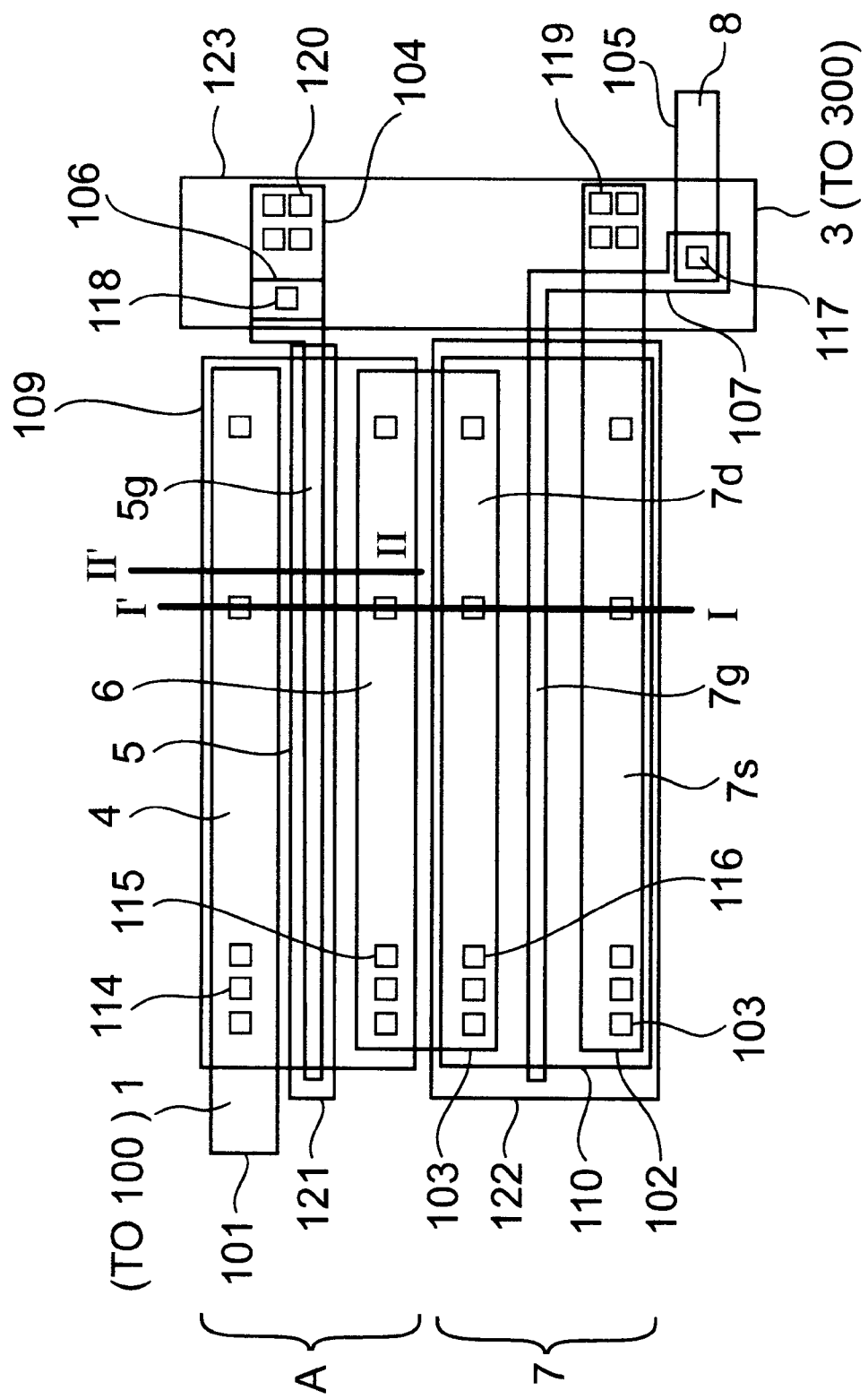
FIG. 2 is a plan view of the semiconductor device of the first embodiment.
Figure 3:
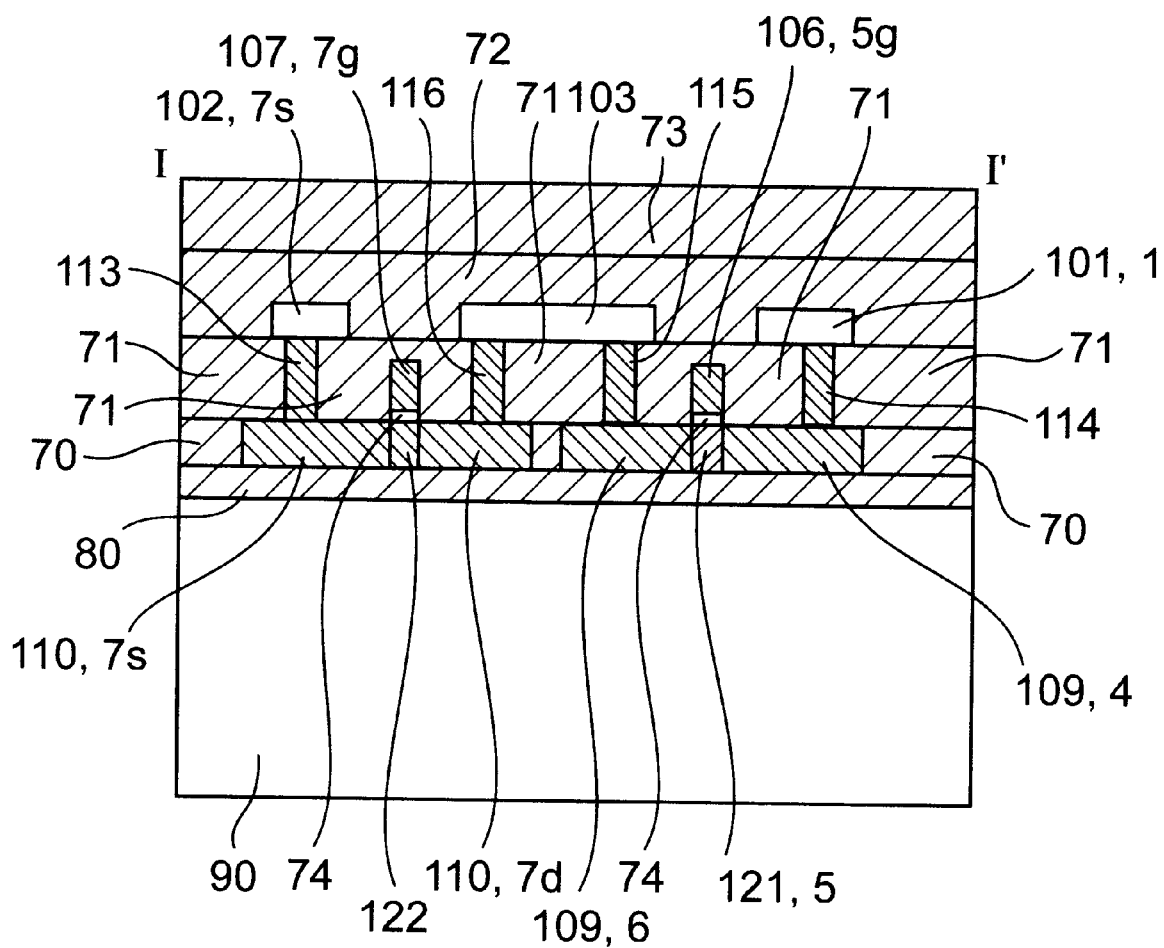
FIG. 3 is a sectional view of the electrostatic discharge protection circuit and a NMOS output transistor, taken along line I–I' shown in FIG. 2.

The protection circuit A and the NMOS output transistor 7 are formed by a SOI-CMOS process. That is, they are provided on a varied insulator 80 that is formed on a surface of a P-type semiconductor substrate 90, as shown in FIGS. 2 and 3. In FIG. 2, reference numbers 101–105 designate first metal layers, reference numbers 106–107 designate Poly-Si layers, reference numbers 109–110 designate N-type impurity highly doped diffusion layers, a reference number 123 designates a second metal layer, reference numbers 113–116 designate contact holes for connecting the first metal layers to diffusion layers, reference numbers 117–118 designate contact holes for connecting the first metal layers to the Poly-Si layers, reference numbers 119–120 designate contact holes for connecting the first metal layers to the second metal layers, a reference number 121 designates an N-type impurity lightly doped diffusion layer, and a reference number 122 designates a P-type impurity lightly doped diffusion layer.

As shown in FIGS. 2 and 3, a gate insulating layer 74 is formed on the lightly doped diffusion layer 5. The gate electrode 5g is formed on the insulating layer 74, which is elongated along the highly doped diffusion layers 4, 6, and across completely the lightly doped diffusion layers 5. The NMOS output transistor 7 is protected from electrostatic discharge by the protection circuit A, the highly doped diffusion layers 4, 6, and the lightly doped diffusion layer 5. In FIG. 3, a reference number 70 designates field oxidation layer, reference numbers 71–72 designate insulating interlayers, and a reference number 73 designates a passivation film.

Figure 4:
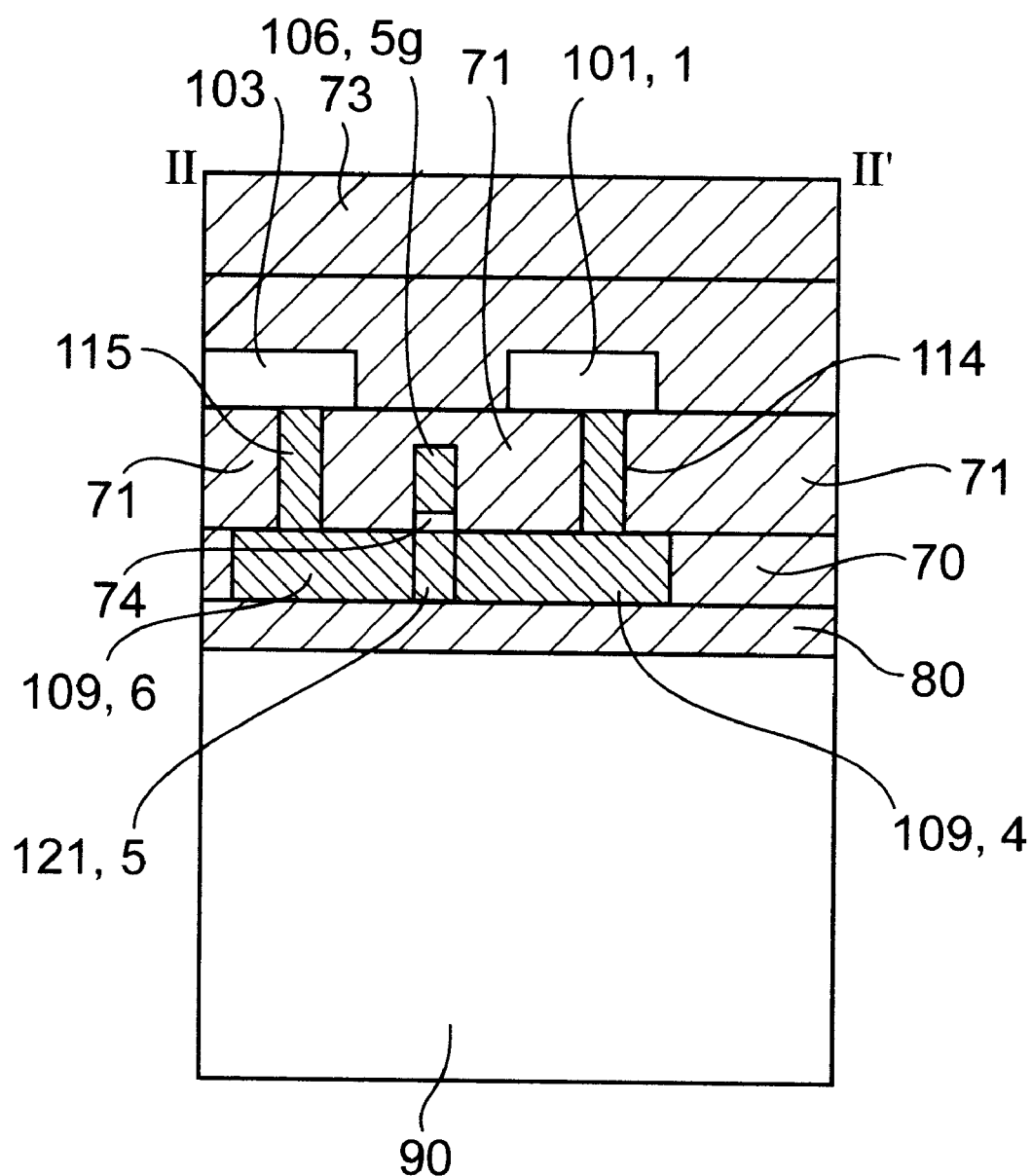
FIG. 4 is a sectional view of the electrostatic discharge protection circuit, taken along line II–II' shown in FIG. 2 when a negative electrostatic surge is applied.
Figure 5:
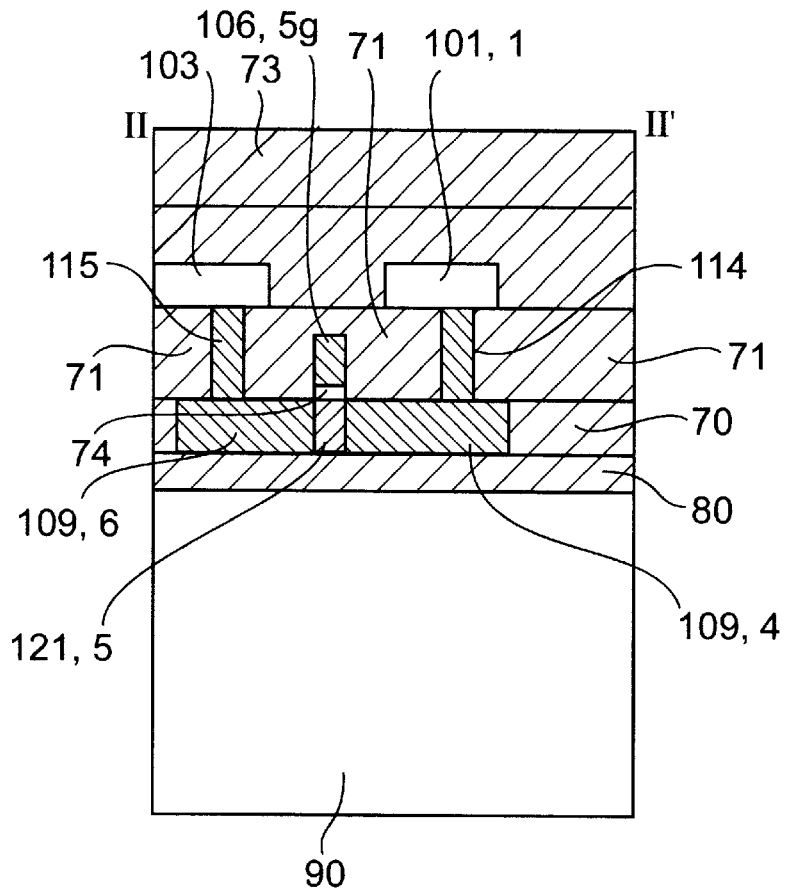
FIG. 5 is a sectional view of the electrostatic discharge protection circuit, taken along line II–II' shown in FIG. 2 when a positive electrostatic surge is applied.

The operation of the protection circuit A is explained below with reference to FIGS. 4 and 5. FIG. 4 is a sectional view of the electrostatic discharge protection circuit when a negative electrostatic surge is applied, taken along line II–II' shown in FIG. 2. If a negative electrostatic surge is applied to the output terminal 100, it has the same effect relatively as that when a positive electrostatic surge is applied to the gate electrode 5g which is connected to the ground line 3. Therefore, as the lightly doped diffusion layer 5 under the gate electrode 5g is changed to an N-type accumulation layer as shown in FIG. 4, the protection circuit A, including the N-type accumulation layer 5 and the N-type highly doped diffusion layers 4, 6, acts as a resistor.

On the other hand, if a positive electrostatic surge is applied to the output terminal 100, it has the same relative effect as that when a negative electrostatic surge is applied to the gate electrode 5g, which is connected to the ground line 3. Therefore, as the lightly doped diffusion layer 5 under the gate electrode 5g is changed to an P-type inversion layer as shown in FIG. 5, the N-type highly doped diffusion layers 4, 6 are isolated from each other by the P-type inversion layer. In this case, the protection circuit A acts as an insulator.

As described above, the protection circuit A is connected between the output line 1 and the NMOS output transistor 7 in series, and acts as the resistor when a negative electrostatic surge is applied, and it acts as the insulator when a positive electrostatic surge is applied. Therefore, when a negative electrostatic surge is applied to the output terminal 100, the surge current is passed to the NMOS output transistor 7 through the protection circuit A, and when a positive electrostatic surge is applied to the output terminal 100, it becomes hard to pass the surge current to the NMOS output transistor 7 through the protection circuit A.

A general NMOS output transistor is easily destroyed with a positive electrostatic surge, because the direction of the current flow of the electrostatic surge is opposite to the forward direction of the current flow in the PN junction at the drain. According to this first embodiment of the invention, the NMOS output transistor 7 can be protected from a positive electrostatic surge by the protection circuit A, which acts as an insulator when a positive electrostatic surge is applied. Further, since the gate electrode 5g of the protection circuit A is fixed to the ground during operation, the lightly doped diffusion layer 5 is maintained N-type. Therefore, the protection circuit A acts as a resistor. Although the protection circuit A is a limiting resistor of the NMOS output transistor 7, the value of the resistor can be designed by setting the width and length of respective interconnections in the protection circuit. That is by setting the resistor sufficiently short and wide, its resistance value can be made low enough that it has no effect for the circuit operation. Accordingly, it is possible to hold the leakage of the output current at a minimum during operation.

Figure 6:
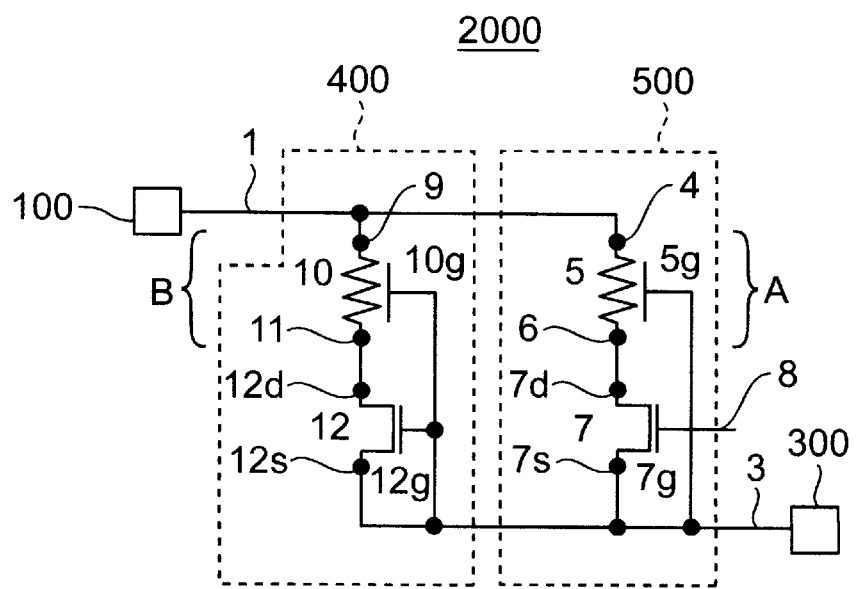
FIG. 6 is a circuit diagram of a semiconductor device having an electrostatic discharge protection circuit according to a second embodiment of the invention.
Figure 7:
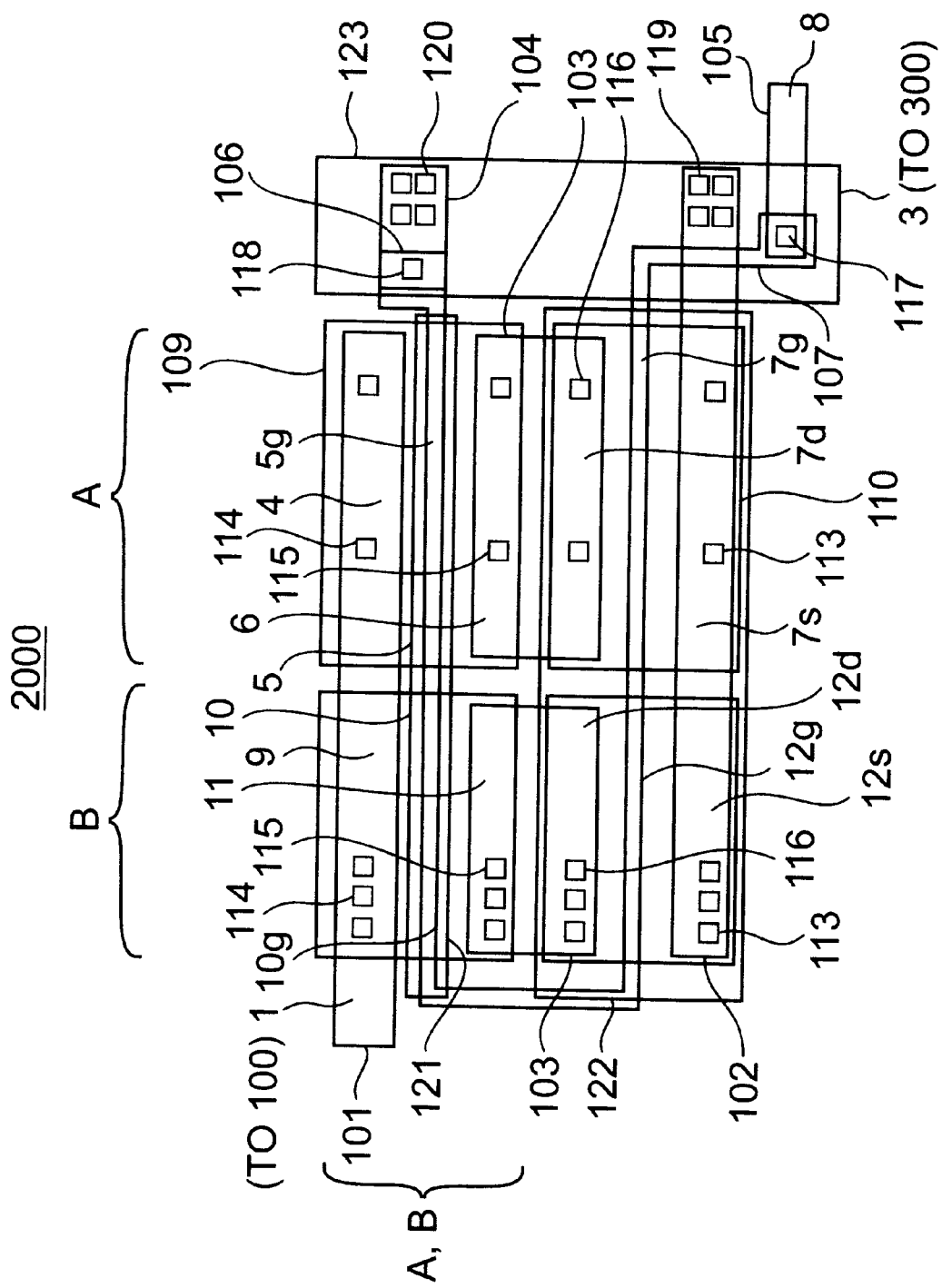
FIG. 7 is a plan view of the semiconductor device of the second embodiment.

A second embodiment is shown in FIGS. 6 and 7. A main feature of the second embodiment is that a semiconductor device 2000 includes two (first and second) electrostatic discharge protection circuits A, B, an NMOS output transistor 7 and a NMOS protection transistor 12. The first protection circuit A and the NMOS output transistor 7 of the second embodiment have the same connections and structures as do the first protection circuit A and the NMOS output transistor 7 of the above-described first embodiment, explanation of their connections and structures is omitted. The second protection circuit B has the same structure and the same connection as do the first protection circuit A. That is, the second protection circuit B includes an N-type impurity lightly doped diffusion layer 10, N-type impurity highly doped diffusion layers 9, 11 sandwiching the lightly doped diffusion layer 10, and a gate electrode 10g formed on a gate insulating layer which is formed on the lightly doped diffusion layer 10. The NMOS protection transistor 12 has a gate electrode 12g, a drain 12d and a source 12s which is connected to the gate electrode 12g. Therefore, the NMOS protection transistor is normally in an off state during operation. The source 12s and the gate electrode 12g are connected to a ground terminal 300 for an external connection, via a connecting line 3. The drain 12d is connected to the highly doped diffusion layer 11. The highly doped diffusion layer 9 is connected to an output terminal 100 for an external connection, via a connecting line 1. The gate electrode 10g is connected to the ground terminal 300. Therefore, the second protection circuit B is connected to the NMOS protection transistor 12 in series, between the output terminal 100 and the ground terminal 300, and the second protection circuit B and the NMOS protection transistor 12 are connected in parallel to the series connected first protection circuit A and NMOS output transistor 7.

The protection circuits A, B, the NMOS output transistor 7 and the NMOS protection transistor 12 are formed by a SOI-CMOS process, as shown in FIG. 7. In FIG. 7, reference numbers 101–105 designate first metal layers, reference numbers 106–107 designate Poly-Si layers, reference numbers 109–112 designate N-type impurity highly doped diffusion layers, a reference number 123 designates a second metal layer, reference numbers 113–118 designate contact holes for connecting the first metal layers to diffusion layers, reference numbers 117–118 designate contact holes for connecting the first metal layers to the Poly-Si layers, reference numbers 119–120 designate contact holes for connecting the first metal layers to the second metal layer, a reference number 121 designates a N-type impurity lightly doped diffusion layer, and a reference number 122 designates a P-type impurity lightly doped diffusion layer.

As shown in FIG. 7, the gate electrode 10g is elongated along the highly doped diffusion layers 9, 11, and across completely the lightly doped diffusion layers 10. The NMOS protection transistor 12 is protected from the electrostatic discharge by the second protection circuit B.

According to the second embodiment of the invention, the NMOS protection circuit for reducing the amount of the surge current passing through an unit area of the NMOS output transistor 7, is protected by the second protection circuit B, and the electrostatic surge current can be branched effectively into the NMOS protection transistor 12 and the NMOS output transistor 7. Therefore, high electrostatic surge resistance can be obtained in the circuit 2000.

Furthermore, as the electrostatic surge current is branched into two branches 400, 500 and the second protection circuit B having a serial connection with the NMOS transistor 12 is disposed in the branch 400, the branch 400 is not always destroyed first. In the second embodiment, it is possible to avoid destruction of the branch 400 even if the amount of the surge current passing through an unit area of the NMOS output transistor 7 causes the breakdown voltage to be exceeded, because the NMOS protection transistor 12 is connected in parallel to the protection circuit A and the NMOS output transistor 7 in order to ease the amount of surge current that passed as through the NMOS output transistor 7.

Figure 8:
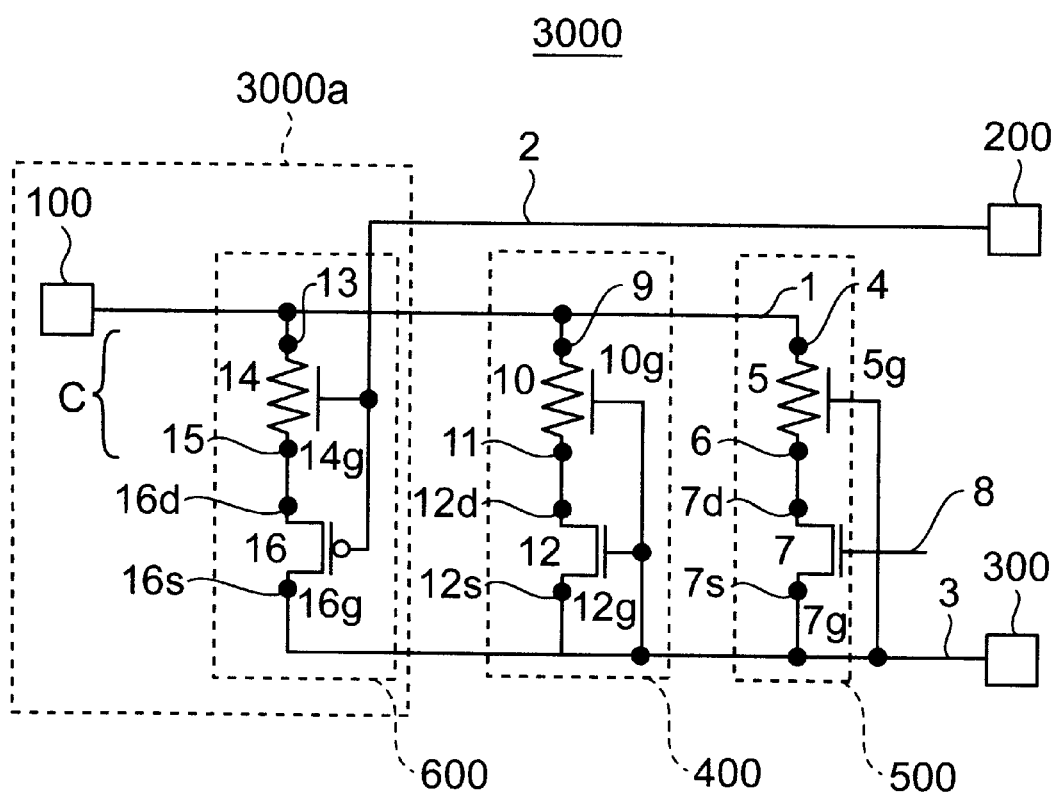
FIG. 8 is a circuit diagram of a semiconductor device having an electrostatic discharge protection circuit according to a third embodiment of the invention.

A third embodiment is shown in FIG. 8 through FIG. 12. A main feature of the third embodiment is that a semiconductor device 3000 further includes a third electrostatic discharge protection circuits C and a PMOS protection transistor 16 in addition to the structure of the semiconductor device 2000. As first and second protection circuits A, B, an NMOS protection transistor 12 and an NMOS output transistor 7 of the third embodiment have the same connections and structures as do the first and the second protection circuits A, B, the NMOS protection transistor 12 and the NMOS output transistor 7 of the second embodiment, the explanation of their connections and structures is omitted. As shown in FIG. 8, the semiconductor device 3000 includes the first, second and third protection circuits A, B, C and the NMOS output transistor 7, the NMOS protection transistor 12 and the PMOS protection transistor 16 whose a gate electrode 16g is connected to a power supply 200 for a external connection via a connecting line 2. Therefore, the PMOS transistor 16 is in normally an off state. The third protection circuit C includes an P-type impurity lightly doped diffusion layer 14, an P-type impurity highly doped diffusion layers 13, 15 sandwiching the lightly doped diffusion layer 14, and a gate electrode 14g formed on an insulating layer which is formed the lightly doped diffusion layer 14. The gate electrode 14g connects the power supply 200. The highly doped diffusion layers 13 is connected to an output terminal 100 for an external connection, via a connecting line 1. The PMOS protection transistor 16 has a gate electrode 16g, a drain 16d and a source 16s. The drain 16d is connected to the highly doped diffusion layers 15, and the source 16s is connected to a ground terminal 300 for an external connection, via a connecting line 3. The gate electrode 16g is also connected to the gate electrode 14g. Therefore, the third protection circuit C is connected to the PMOS protection transistor 16 in series between the output terminal 100 and the ground terminal 300, and further, the third protection circuit C and the PMOS protection transistor 16 are connected in parallel to the first protection circuit A and the second protection circuit B.

Figure 9:
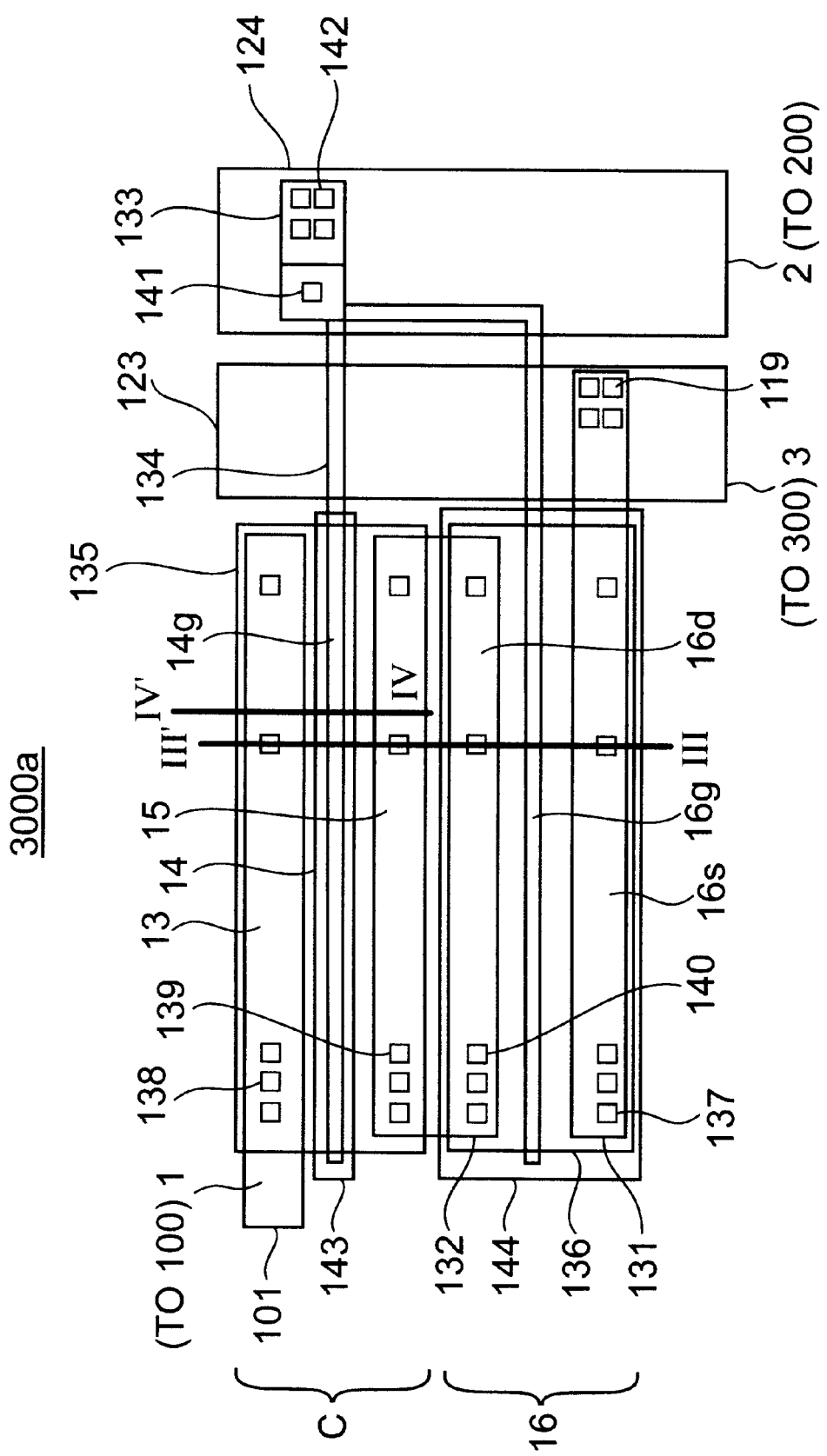
FIG. 9 is a plan view of the electrostatic discharge protection circuit and a PMOS protection transistor of the third embodiment.

The protection circuit C and the PMOS protection circuit 16 are formed by using a SOI-CMOS process, as shown in FIG. 9. In FIG. 9, reference numbers 101 and 131–133 designate first metal layers, a reference number 134 designates a Poly-Si layer, reference numbers 135–136 designate P-type impurity highly doped diffusion layers, reference numbers 123–124 designate second metal layers, reference numbers 137–140 designate contact holes for connecting the first metal layers to the diffusion layers, a reference number 141 designates a contact holes for connecting the first metal layers to the Poly-Si layer, reference numbers 119 and 142 designate contact holes for connecting the first metal layers to the second metal layers, a reference number 143 designates a P-type impurity lightly doped diffusion layer, and a reference number 144 designates an N-type impurity lightly doped diffusion layer.

Figure 10:
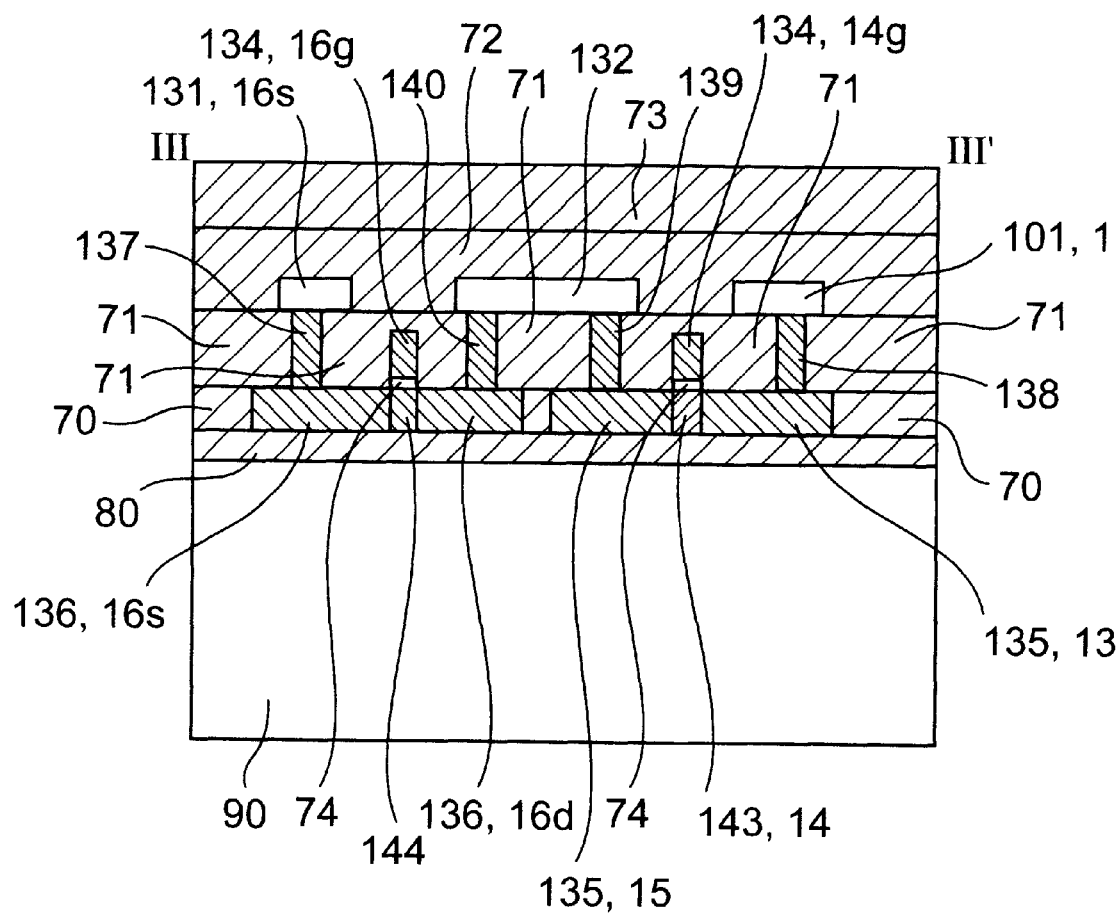
FIG. 10 is a sectional view of the electrostatic discharge protection circuit and the PMOS protection transistor, taken along line III–III' shown in FIG. 9.

Referring to FIG. 9, the gate electrode 14g is elongated along the highly doped diffusion layers 13, 15, and across completely the lightly doped diffusion layer 14. The PMOS protection transistor 16 is protected from the electrostatic discharge by the third protection circuit C. In FIG. 10, a reference number 70 designates field oxidation layer, reference numbers 71–72 designate insulating interlayers, a reference number 73 designates a passivation film, a reference number 80 designates a varied oxide layer, and a reference number 90 refers to a P-type substrate.

Figure 11:
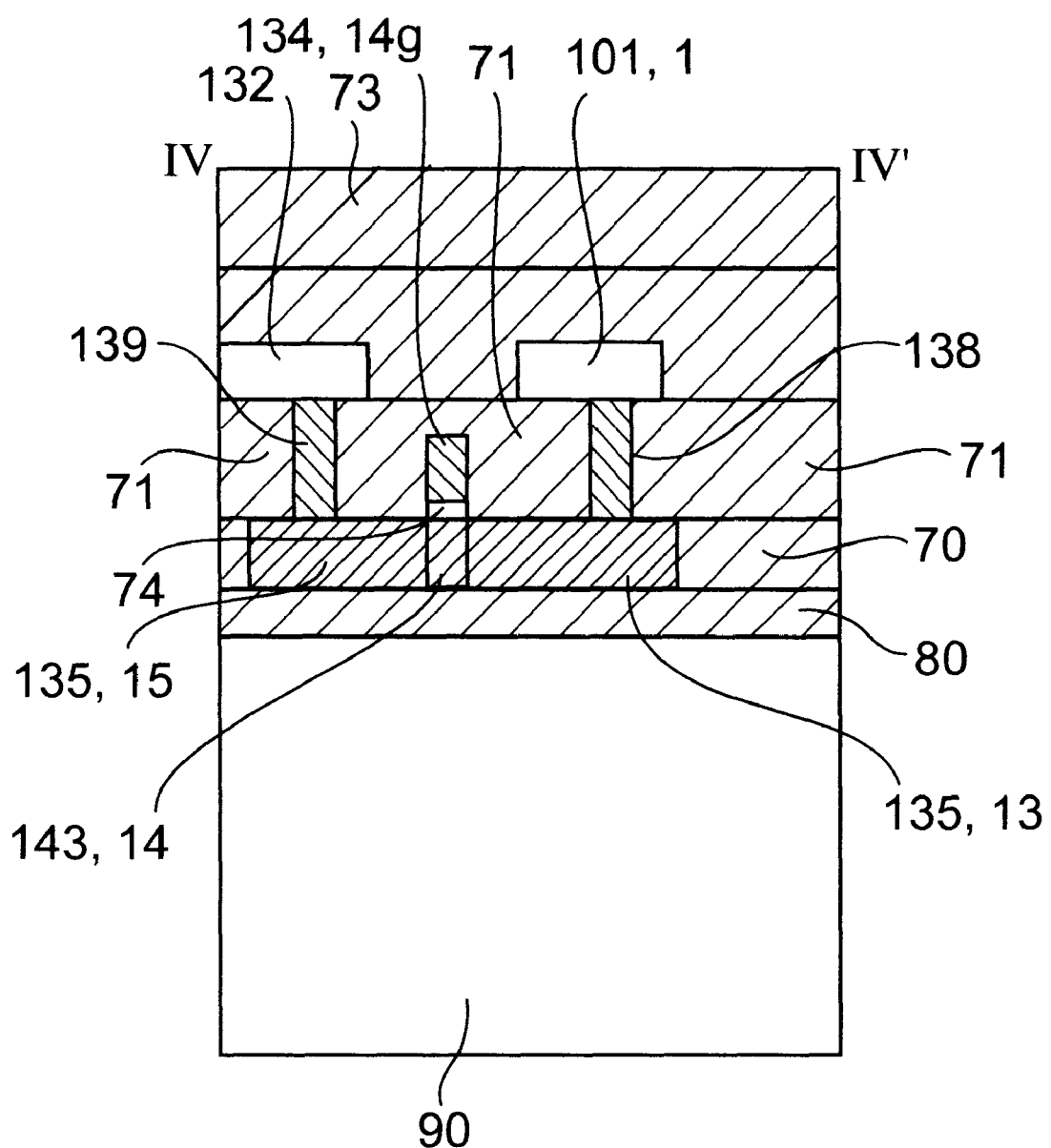
FIG. 11 is a sectional view of the electrostatic discharge protection circuit, taken along line IV–IV' shown in FIG. 9 when a positive electrostatic surge is applied.
Figure 12:
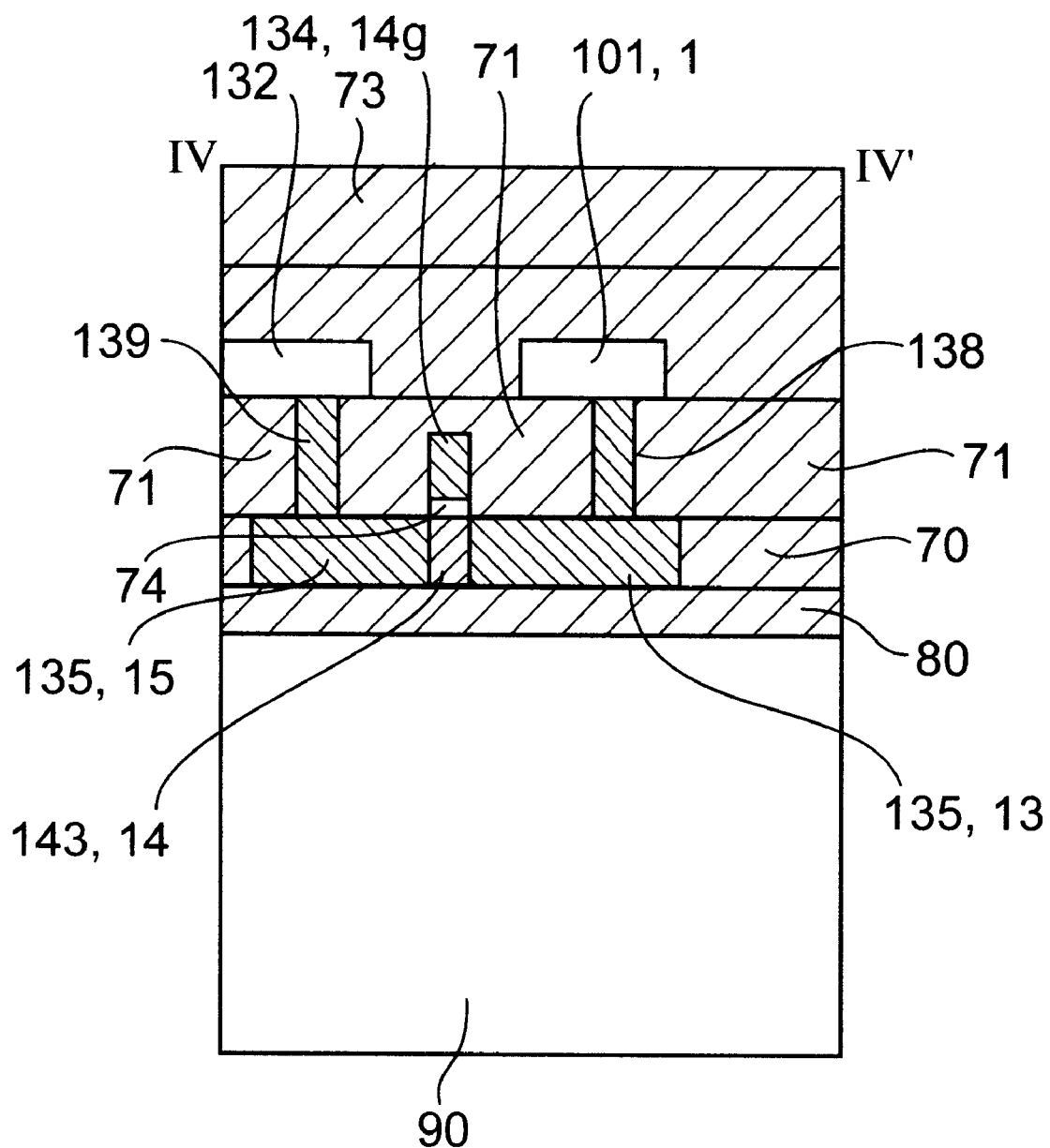
FIG. 12 is a sectional view of the electrostatic discharge protection circuit, taken along line IV–IV' shown in FIG. 9 when a negative electrostatic surge is applied.

The operation of the third protection circuit C is explained below with reference to FIGS. 11 and 12. FIG. 11 is a sectional view of the third protection circuit C and the PMOS protection transistor 16 when a positive electrostatic surge is applied, taken along line III–III' shown in FIG. 9. If a negative electrostatic surge is applied to the output terminal 100, it has the same effect relatively as that when a negative electrostatic surge is applied to the gate electrode 14g. Therefore, as the lightly doped diffusion layer 14 is changed to an P-type accumulation layer as shown in FIG. 11, the third protection circuit C including the P-type accumulation layer 14 and the P-type highly doped diffusion layers 13, 15 acts as a resistor.

On the other hand, if a negative electrostatic surge is applied to the output terminal 100, it has the same effect relatively as that when a positive electrostatic surge is applied to the gate electrode 14g. Therefore, as the lightly doped diffusion layer 14 is changed to an N-type inversion layer as shown in FIG. 12, the P-type highly doped diffusion layers 13, 15 are isolated each other by the N-type inversion layer 14. In this case, the third protection circuit C acts as the act as an insulator.

According to the third embodiment, when a negative electrostatic surge is applied between the output terminal 100 and the ground terminal 300, the first protection circuit A and/or the second protections circuit B acts as the resistor and the third protection circuit C acts as the insulator. Therefore, the surge current is not passed through the PMOS protection transistor which is easily destroyed with a negative electrostatic surge, and is passed through the NMOS output transistor 7 and/or the NMOS protection transistor 12 which are not easily destroyed with a negative electrostatic surge.

As mentioned before, generally, NMOS transistors are easily destroyed with a positive electrostatic surge, and PMOS transistors are easily destroyed with a negative electrostatic surge. According to the third embodiment, since the first and the second protection circuits A, B acting as the insulators against a positive electrostatic surge are connected to the NMOS output transistor 7 and the NMOS protection transistor 12 in series respectively, it is hard to pass the surge current in the branches 400, 500. On the other hand, as the third protection circuit C acting as the resistor against a positive electrostatic surge is connected to the PMOS protection transistor 16, the surge current is passed through a branch 600 in the forward direction of the PN junction of the PMOS transistor 16. Therefore, the improved electrostatic surge resistance can be obtained against a positive surge.

On the other hand, since the first and the second protection circuits A, B act as the resistors against a negative electrostatic surge, the surge current is passed through the NMOS output transistor 7 and the NMOS protection transistor 12 in the forward direction of the PN junction. Further, as the third protection circuit C is act as the insulator against a negative electrostatic surge, it is possible to avoid to pass the surge current through the branch 600. Therefore, further improved electrostatic surge resistance also can be obtained against a negative surge because the surge current is not passed through the NP junction of the branch 600. Here, as the gate electrode 16g of the PMOS transistor 16 is connected to the power supply 200, the PMOS transistor 16 has no influence on the semiconductor device during operation.

Figure 13:
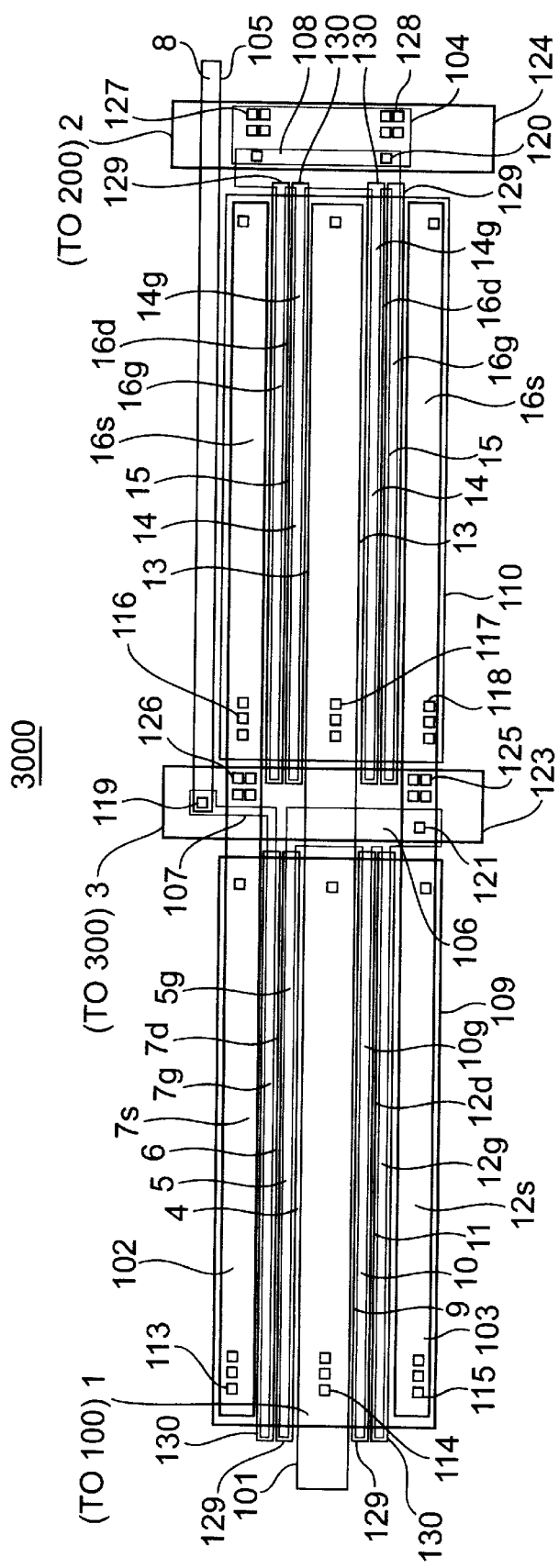
FIG. 13 is a plan view of the semiconductor device of the third embodiment.

Furthermore, The protection circuits A, B, C, the NMOS output transistor 7, the NMOS protection transistor 12 and the PMOS protection circuit 16 can be formed on the Si-substrate by using a SOI-CMOS process, as shown in FIG. 13. In FIG. 13, reference numbers 101–105 designate first metal layers, reference number 106–108 designate Poly-Si layers, a reference number 109 refers to an N-type impurity highly doped diffusion layer, a reference number 110 refers to a P-type impurity highly doped diffusion layer, reference numbers 123–124 designate second metal layers, reference numbers 113–118 designate contact holes for connecting the first metal layers to the diffusion layers, reference numbers 119–121 designate a contact holes for connecting the first metal layers to the Poly-Si layers, reference numbers 125–128 designate contact holes for connecting the first metal layers to the second metal layers, a reference number 129 refers to a N-type impurity lightly doped diffusion layer, and a reference number 130 refers to an P-type impurity lightly doped diffusion layer. According to this structure, as the highly doped diffusion layer 15 of the third protection circuit C and the drain 16*d* of the PMOS protection transistor 16 are formed in a single region, it is not necessary to form a interconnection to be connected to each other. Therefore, it is possible to reduce the size of the semiconductor device.

Figure 14:
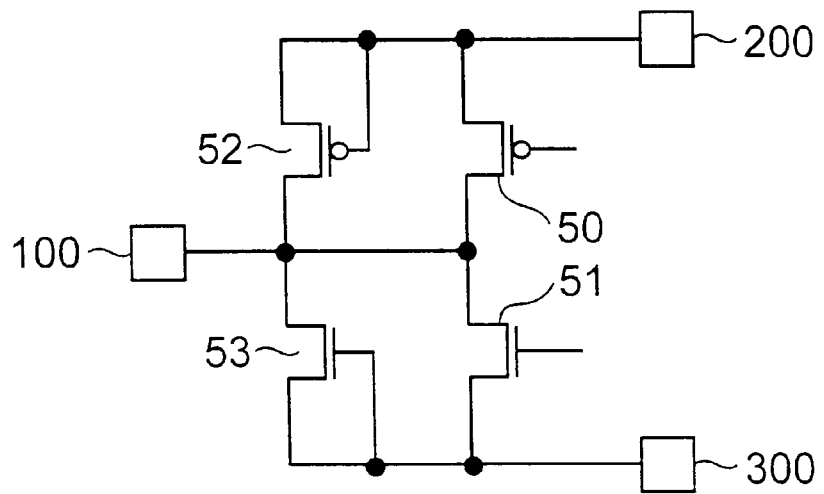
FIG. 14 is a circuit diagram of a semiconductor device having a conventional electrostatic discharge protection circuit.
Figure 15:
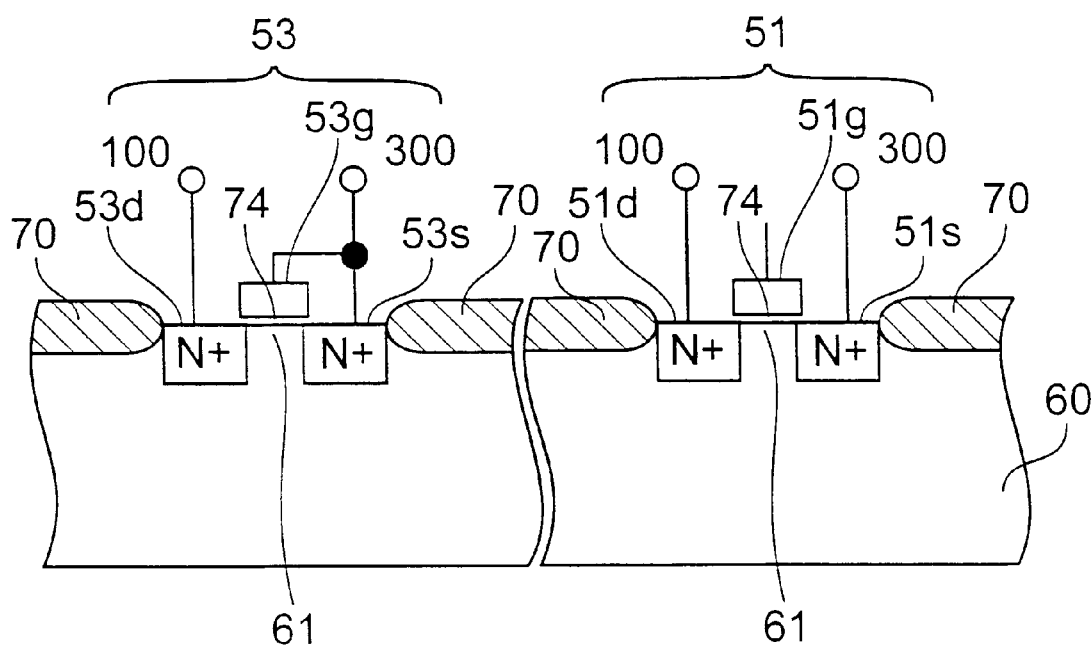
FIG. 15 is a sectional view of NMOS transistors formed by a CMOS process, which are used in the electrostatic discharge protection circuit shown in FIG. 14.
Figure 16:
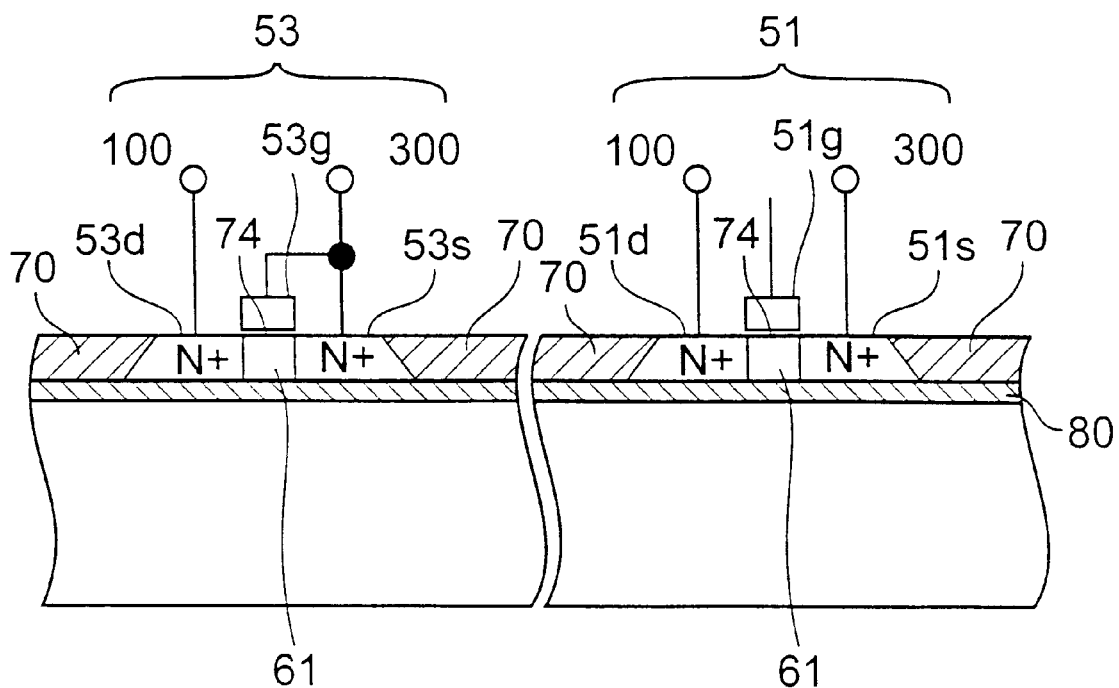
FIG. 16 is a sectional view of NMOS transistors formed by a SOI-CMOS process which are used in the electrostatic discharge protection circuit shown in FIG. 14.

While the invention has been described with reference to illustrative embodiments, this description is not intended to be construed in a limiting sense. Various modifications of the illustrated embodiments, as well as other embodiments of the invention, will be apparent to those skilled in the art on reference to this description. For example, although the NMOS transistor is used for the output transistor in all embodiments, the same concept of the invention can be applied if a PMOS output transistor is used. Further, although all embodiments are explained as to the circuit for protecting the NMOS output transistor, all concept of the invention also can be used for the circuit for protecting the PMOS output transistor. Therefore, all concept of the invention can be used for the CMOS output circuit including the NMOS output transistor and the PMOS output transistor which are connected each other by an output line. Furthermore, all concept of the invention can be used for the total semiconductor device further including an I/O terminal which is connected to the output line for an input gate. Further, the highly doped diffusion layer 6 of the first protection circuit A and the drain 7*d* of the output transistor of a first conductivity type may be formed in the single region, and the highly doped diffusion layer 11 of the second protection circuit B and the drain 12*d* of the protection transistor 12 of a first conductivity type may be formed in the single region as well as the formation of the third protection circuit C and the drain 16*d* of the protection transistor 16 of a second conductivity type which are illustrated in FIG. 14. Therefore, the appended claims are intended cover any such modifications or embodiments as fall within the true scope of the invention.

What I claim is:

1. A semiconductor device manufactured by a SOI-CMOS process, comprising:
    an output terminal and a ground terminal;
    an insulator;
    a first electrostatic discharge protection circuit formed on the insulator, the first electrostatic discharge protection circuit including a first lightly doped diffusion layer of a first conductivity type, two first highly doped diffusion layers of the first conductivity type, and a first gate electrode formed on the first lightly doped layer, the first lightly doped diffusion layer being sandwiched by the first highly doped layers, one of the first highly doped layers being connected to the output terminal and the first gate electrode being connected to the ground terminal, and the first electrostatic discharge protection circuit serving as a resistor or an insulator according to the polarity of an electrostatic surge applied to the output terminal; and
    a first conductivity type output transistor having a gate electrode, a source and a drain, the source being connected to the ground terminal;
    wherein the first electrostatic discharge protection circuit and the first conductivity type output transistor are connected to each other in series between the output terminal and the ground terminal.

2. A semiconductor device as claimed in claim 1, wherein the first conductivity type is N-type.

3. A semiconductor device as claimed in claim 1, further comprising:
    a second electrostatic discharge protection circuit formed on the insulator, the second electrostatic discharge protection circuit including a second lightly doped diffusion layer of the first conductivity type, two second highly doped diffusion layers of the first conductivity type, and a second gate electrode formed on the second lightly doped layer, the second lightly doped diffusion layer being sandwiched by the second highly doped layers, one of the second highly doped layers being connected to the output terminal and the second gate electrode being connected to the ground terminal, and the second electrostatic discharge protection circuit serving as a resistor or an insulator according to the polarity of an electrostatic surge applied to the output terminal; and
    a first conductivity type protection transistor having a gate electrode, a source and a drain, the source and the gate electrode being commonly connected to the ground terminal and the second gate electrode;
    wherein the second electrostatic discharge protection circuit and the first conductivity type protection transistor are connected to each other in series between the output terminal and the ground terminal; and
    whereby the first electrostatic discharge protection circuit and the output transistor are connected in parallel to the second electrostatic discharge protection circuit and the protection transistor, between the output terminal and the ground terminal.

4. A semiconductor device as claimed in claim 3, wherein the first conductivity type is N-type.

5. A semiconductor device as claimed in claim 1, further comprising:
    a power supply terminal;
    a third electrostatic discharge protection circuit formed on the insulator, the third electrostatic discharge protection circuit including a third lightly doped diffusion layer of a second conductivity type, two third highly doped diffusion layers of the second conductivity type, and a third gate electrode formed on the third lightly doped layer, the third lightly doped diffusion layer being sandwiched by the third highly doped layers, one of the third highly doped layers being connected to the output terminal and the third gate electrode being connected to the power supply terminal, and the third electrostatic discharge protection circuit serving as an insulator or a resistor according to the polarity of an electrostatic surge applied to the output terminal; and
    a second conductivity type protection transistor having a gate electrode, a source and a drain, the source being connected to the ground terminal and the gate electrode being connected to the power supply terminal;
    wherein the third electrostatic discharge protection circuit and the second conductivity type protection transistor are connected to each other in series between the output terminal and the ground terminal; and
    whereby the first electrostatic discharge protection circuit and the output transistor are connected in parallel to the third electrostatic discharge protection circuit and the protection transistor, between the output terminal and the ground terminal.

6. A semiconductor device as claimed in claim 3, wherein the first conductivity type is N-type, and wherein the second conductivity type is P-type.

7. A semiconductor device as claimed in claim 3, further comprising, a power supply terminal;

a third electrostatic discharge protection circuit formed on the insulator, the third electrostatic discharge protection circuit including a third lightly doped diffusion layer of a second conductivity type, two third highly doped diffusion layers of the second conductivity type, and a third gate electrode formed on the third lightly doped layer, the third lightly doped diffusion layer being sandwiched by the third highly doped layers, one of the third highly doped layers being connected to the output terminal and the third gate electrode being connected to the power supply terminal, and the third electrostatic discharge protection circuit serving as an insulator or a resistor according to the polarity of an electrostatic surge applied to the output terminal; and a second conductivity type protection transistor having a gate electrode, a source and a drain, the source being connected to the ground terminal and the gate electrode being connected to the power supply terminal;

wherein the third electrostatic discharge protection circuit and the second conductivity type protection transistor are connected to each other in series between the output terminal and the ground terminal; and whereby the first and second electrostatic discharge protection circuits are connected in parallel to the third electrostatic discharge protection circuit, between the output terminal and the ground terminal.

8. A semiconductor device as claimed in claim 3, wherein the first conductivity type is N-type, and wherein the second conductivity type is P-type.

9. A semiconductor device as claimed in claim 1, wherein another first highly doped diffusion layer and a drain of the output transistor are formed in a single region.

10. A semiconductor device as claimed in claim 3, wherein another second highly doped diffusion layer and a drain of the protection transistor are formed in a single region.

11. A semiconductor device as claimed in claim 5, wherein another third highly doped diffusion layer and a drain of the protection transistor are formed in a single region.

12. A semiconductor device as claimed in claim 11, wherein another first highly doped diffusion layer and a drain of the output transistor are formed in a single region, and wherein another second highly doped diffusion layer and a drain of the first conductivity type protection transistor are formed in a single region.

13. A semiconductor device manufactured by a SOI-CMOS process, comprising:

an power supply terminal, an output terminal and a ground terminal;

an insulator;

a first electrostatic discharge protection circuit formed on the insulator, the first electrostatic discharge protection circuit including a first lightly doped diffusion layer of a first conductivity type, two first highly doped diffusion layers of the first conductivity type, and a first gate electrode formed on the first lightly doped layer, the first lightly doped diffusion layer being sandwiched by the first highly doped layers, one of the first highly doped layers being connected to the output terminal and the first gate electrode being connected to the power supply terminal, and the first electrostatic discharge protection circuit serving as a resistor or an insulator according to the polarity of an electrostatic surge applied to the output terminal; and a first conductivity type output transistor having a gate electrode, a source and a drain, the source being connected to the ground terminal;

wherein the first electrostatic discharge protection circuit and the first conductivity type output transistor are connected to each other in series between the output terminal and the ground terminal.

14. A semiconductor device as claimed in claim 13, wherein the first conductivity type is P-type.

15. A semiconductor device as claimed in claim 13, further comprising, a second electrostatic discharge protection circuit formed on the insulator, the second electrostatic discharge protection circuit including a second lightly doped diffusion layer of the first conductivity type, two second highly doped diffusion layers of the first conductivity type, and a second gate electrode formed on the second lightly doped layer, the second lightly doped diffusion layer being sandwiched by the second highly doped layers, one of the second highly doped layers being connected to the output terminal and the second gate electrode being connected to the power supply terminal, and the second electrostatic discharge protection circuit serving as a resistor or an insulator according to the polarity of an electrostatic surge applied to the output terminal; and a first conductivity type protection transistor having a gate electrode, a source and a drain, the source being connected to ground terminal, and the gate electrode being connected to the power supply terminal and the second gate electrode;

wherein the second electrostatic discharge protection circuit and the first conductivity type protection transistor are connected to each other in series between the output terminal and the ground terminal; and whereby the first electrostatic discharge protection circuit and the output transistor are connected in parallel to the second electrostatic discharge protection circuit and the protection transistor, between the output terminal and the ground terminal.

16. A semiconductor device as claimed in claim 15, wherein the first conductivity type is P-type.

17. A semiconductor device as claimed in claim 13, further comprising, a third electrostatic discharge protection circuit formed on the insulator, the third electrostatic discharge protection circuit including a third lightly doped diffusion layer of a second conductivity type, two third highly doped diffusion layers of the second conductivity type, and a third gate electrode formed on the third lightly doped layer, the third lightly doped diffusion layer being sandwiched by the third highly doped layers, one of the third highly doped layers being connected to the output terminal and the third gate electrode being connected to the ground terminal, and the third electrostatic discharge protection circuit serving as an insulator or a resistor according to the polarity of an electrostatic surge applied to the output terminal; and a second conductivity type protection transistor having a gate electrode, a source and a drain, the source being connected to the ground terminal and the gate electrode being connected to the ground terminal;

wherein the third electrostatic discharge protection circuit and the second conductivity type protection transistor are connected to each other in series between the output terminal and the ground terminal; and whereby the first electrostatic discharge protection circuit and the output transistor are connected in parallel to the third electrostatic discharge protection circuit and the protection transistor, between the output terminal and the ground terminal.

18. A semiconductor device as claimed in claim 17, wherein the first conductivity type is P-type, and wherein the second conductivity type is N-type.

19. A semiconductor device as claimed in claim 15, further comprising, a third electrostatic discharge protection circuit formed on the insulator, the third electrostatic discharge protection circuit including a third lightly doped diffusion layer of a second conductivity type, two third highly doped diffusion layers of the second conductivity type, and a third gate electrode formed on the third lightly doped layer, the third lightly doped diffusion layer being sandwiched by the third highly doped layers, one of the third highly doped layers being connected to the output terminal and the third gate electrode being connected to the ground terminal, and the third electrostatic discharge protection circuit serving as an insulator or a resistor according to the polarity of an electrostatic surge applied to the output terminal; and a second conductivity type protection transistor having a gate electrode, a source and a drain, the source being connected to the ground terminal, its gate electrode and third gate electrode;

wherein the third electrostatic discharge protection circuit and the second conductivity type protection transistor are connected to each other in series between the output terminal and the ground terminal; and whereby the first and second electrostatic discharge protection circuits are connected in parallel to the third electrostatic discharge protection circuit, between the output terminal and the ground terminal.

20. A semiconductor device as claimed in claim 19, wherein the first conductivity type is P-type, and wherein the second conductivity type is N-type.

* * * * *